United States Patent
Zhang

(10) Patent No.: US 11,714,557 B2
(45) Date of Patent: Aug. 1, 2023

(54) SPD-BASED MEMORY MONITORING AND SERVICE LIFE PREDICTION METHOD AND SYSTEM

(71) Applicant: INSPUR SUZHOU INTELLIGENT TECHNOLOGY CO., LTD., Jiangsu (CN)

(72) Inventor: Fang Zhang, Jiangsu (CN)

(73) Assignee: INSPUR SUZHOU INTELLIGENT TECHNOLOGY CO., LTD., Jiangsu (CN)

(*) Notice: Subject to any disclaimer, the term of this patent is extended or adjusted under 35 U.S.C. 154(b) by 0 days.

(21) Appl. No.: 17/928,118

(22) PCT Filed: Jan. 23, 2021

(86) PCT No.: PCT/CN2021/073439
§ 371 (c)(1),
(2) Date: Nov. 28, 2022

(87) PCT Pub. No.: WO2021/238257
PCT Pub. Date: Dec. 2, 2021

(65) Prior Publication Data
US 2023/0195322 A1    Jun. 22, 2023

(30) Foreign Application Priority Data

May 27, 2020  (CN) .......................... 202010463689.7

(51) Int. Cl.
*G06F 3/06* (2006.01)
(52) U.S. Cl.
CPC .......... *G06F 3/0616* (2013.01); *G06F 3/0653* (2013.01); *G06F 3/0683* (2013.01)

(58) Field of Classification Search
None
See application file for complete search history.

(56) References Cited

U.S. PATENT DOCUMENTS

2007/0263444 A1  11/2007  Gorobets et al.
2017/0131947 A1   5/2017  Hoang et al.

FOREIGN PATENT DOCUMENTS

| CN | 109032807 A | 12/2018 |
|----|-------------|---------|
| CN | 111752481 A | 10/2020 |

OTHER PUBLICATIONS

PCT/CN2021/073439 international search report, 4 pages, dated Apr. 9, 2021.

*Primary Examiner* — Kevin Verbrugge
(74) *Attorney, Agent, or Firm* — IPro, PLLC

(57) ABSTRACT

An SPD-based memory monitoring and service life prediction method and system. Said method includes: acquiring parameter information of each memory bank in a server, and setting a weight for the parameter information; reading configuration information of each memory bank, and calculating occupation ratio information of parameters of each memory bank according to the configuration information and the parameter information; calculating state information of each memory bank according to the weight and the occupation ratio information; determining an influence factor according to the number of CPUs in the server and the number and position of memory banks in each CPU; and calculating a final memory state value according to the influence factor and the state information, and according to the used time and the state information of each memory bank, calculating the remaining service life of each memory bank by means of piecewise fitting using a least square method.

20 Claims, 2 Drawing Sheets

SPD-BASED MEMORY MONITORING AND SERVICE LIFE PREDICTION METHOD AND SYSTEM

CROSS-REFERENCE TO RELATED APPLICATION

The present disclosure claims the priority of the Chinese patent application filed on May 27, 2020 before the CNIPA, China National Intellectual Property Administration with the application number of 202010463689.7 and the title of "SPD-BASED MEMORY MONITORING AND SERVICE LIFE PREDICTION METHOD AND SYSTEM", which is incorporated herein in its entirety by reference.

TECHNICAL FIELD

The present disclosure relates to the technical field of software development and, more particular, to an SPD-based memory monitoring and service life prediction method and system.

BACKGROUND

At present, users of servers have a high demand for the memory, both in capacity and efficiency. Once the memory is damaged, the server will be unable to start up or suffer other serious losses. Therefore, the demand for memory monitoring and life prediction has already become a priority.

It is currently possible to view an information overview of each memory bank by the out-of-band BMC interface, or to obtain memory information by some commands that come with Linux. However, these merely provide a memory information overview of servers and do not provide a summary of memory health status and a life prediction, nor automatic memory information monitoring and life prediction. Now, many developers have made memory monitoring strategies, but few have proposed detailed monitoring methods and memory life prediction methods.

SUMMARY

The present disclosure provides an SPD-based memory monitoring and life prediction method and system, which may monitor memory and predict life according to requirements.

In order to achieve the above objective, the present disclosure provides an SPD-based memory monitoring and life prediction method and system. The method includes the steps of:

acquiring parameter information of each memory bank in a server, and setting a weight for the parameter information;

reading configuration information of each memory bank in the server, and calculating proportion information of each memory bank parameter according to the configuration information and the parameter information; calculating state information of each memory bank according to the weight and the proportion information;

determining an impact factor according to the number of CPU in the server as well as the number and the location of memory banks in each CPU; calculating a final memory state value according to the impact factor and the state information, and grading the state value; and calculating remaining life of each memory bank by a least square piecewise fitting method according to the using time and the state information of each memory bank.

In an embodiment of the present disclosure, the method further includes:

setting pending execution time to perform regular execution monitoring and memory bank life prediction; and setting a cron expression to perform periodic execution monitoring and memory bank life prediction.

In an embodiment of the present disclosure, the parameter information of each memory bank in the server includes an erasing-writing speed $v_i$, access data delay time $t_i$, a maximum frequency $f_i$ in operation, an average temperature $te_i$ and an average voltage $vo_i$ in operation; where i is a number of the memory bank.

In an embodiment of the present disclosure, a formula for calculating the proportion information of each memory bank parameter according to the configuration information and the parameter information is $$rv_i = \frac{v_i}{V_i}, rt_i = \frac{t_i}{T_i}, rf_i = \frac{f_i}{F_i}, rte_i = \frac{te_i}{TE_i}, rvo_i = \frac{vo_i}{VO_i};$$

wherein $rv_i$ is proportion information of the erasing-writing speed; $rt_i$ is proportion information of access data delay time; $rf_i$ is proportion information of the maximum frequency in operation; $rte_i$ is proportion information of the average temperature in operation; $rvo_i$ is proportion information of the average voltage; $V_i$ is erasing-writing speed of the configuration information of the memory bank; $T_i$ is access data delay time of the configuration information of the memory bank; $F_i$ is maximum frequency in operation of the configuration information of the memory bank; $TE_i$ is average temperature in operation of the configuration information of the memory bank; and $VO_i$ is average voltage in operation of the configuration information of the memory bank.

In an embodiment of the present disclosure, a formula for calculating the state information of each memory bank according to the weight and the proportion information is: the state information $s_i$ of each memory bank=$\omega_v * rv_i + \omega_t * rt_i + \omega_f * rf_i + \omega_{te} * rte_i + \omega_{vo} * rvo_i$, where $\omega_v$ is a weight of the erasing-writing speed; $\omega_t$ is a weight of the access data delay time; $\omega_f$ is a weight of maximum frequency in operation; $\omega_{te}$ is a weight of the average temperature in operation; and $\omega_{vo}$ is a weight of the average voltage in operation.

In an embodiment of the present disclosure, a formula for calculating the final memory state value according to the impact factor and the state information is: the memory state $$S = \sum_{i=1}^{n}(\omega_i * s_i + \varepsilon_i) + c;$$

wherein $\omega_i$ represents an impact factor; $\varepsilon_i$ represents a random error with a mean value of 0 and a variance of 0.1; and c is a constant term.

In an embodiment of the present disclosure, the method of calculating the remaining life of each memory bank by a least square piecewise fitting method according to the using time and the state information of each memory bank includes:

performing data interpolation and piecewise least square fitting for discrete data corresponding to each memory bank to obtain a fitting function $f(s_i, t_d)$ with a smallest error sum of squares corresponding to each memory bank; and making $s_i$ tend to zero to obtain the predicted total life of the memory bank, and obtain the remaining life $TL_i$ of the memory bank.

The present disclosure also provides an SPD-based memory monitoring and life prediction method and system, including an acquisition and setting module, a read and calculation module, a determination and calculation module and a fitting and calculation module;

the acquisition and setting module is configured for acquiring parameter information of each memory bank in a server, and setting a weight for the parameter information;

the read and calculation module is configured for reading configuration information of each memory bank in the server, and calculating proportion information of each memory bank parameter according to the configuration information and the parameter information; calculating state information of each memory bank according to the weight and the proportion information;

the determination and calculation module is configured for determining an impact factor according to a quantity of CPU in the server as well as a quantity and a location of memory banks in each CPU; calculating a final memory state value according to the impact factor and the state information, and grading the state value; and the fitting and calculation module is configured for calculating remaining life of each memory bank by a least square piecewise fitting method according to the using time and the state information of each memory bank.

In an embodiment of the present disclosure, the system further includes an execution module;

the execution module is configured for setting pending execution time to perform regular execution monitoring and memory bank life prediction; or setting a cron expression to perform periodic execution monitoring and memory bank life prediction.

The effects provided in the summary of the disclosure are merely the effects of the embodiments, not all the effects of the disclosure, and one of the above technical solutions has the following advantages or beneficial effects:

The embodiment of the present disclosure provides an SPD-based memory monitoring and life prediction method and system. The method includes the steps of: acquiring parameter information of each memory bank in the server, and setting a weight for the parameter information; reading configuration information of each memory bank in the server, and calculating proportion information of each memory bank parameter according to the configuration information and the parameter information; calculating state information of each memory bank according to the weight and the proportion information; determining an impact factor according to a quantity of CPU in the server as well as a quantity and a location of memory banks in each CPU; calculating a final memory state value according to the impact factor and the state information, and grading the state value; and calculating remaining life of each memory bank by a least square piecewise fitting method according to the using time and the state information of each memory bank. The method further includes setting pending execution time to perform regular execution monitoring and memory bank life prediction; and setting a cron expression to perform periodic execution monitoring and memory bank life prediction. Based on the SPD-based memory monitoring and life prediction method of the present disclosure, the present disclosure also provides an SPD-based memory monitoring and life prediction system. The SPD-based memory monitoring and life prediction method of the present disclosure may provide an overview of the overall health state of the server memory as well as the remaining life prediction and check the parameter condition of each memory bank. Memory usage and health state may be monitored dynamically on an immediate, regular or periodic basis as needed, and the occurrence of memory failure may be prevented in advance according to the health state or the remaining life, and memory problem may be checked according to a generated log after the memory failure, so as to locate the memory bank failure and the cause of the failure.

BRIEF DESCRIPTION OF THE DRAWINGS

In order to more clearly explain the embodiments of the present disclosure or the technical solutions in the prior art, a brief description will be given below with reference to the accompanying drawings used in the description of the embodiments or the prior art. Obviously, the drawings in the description below are merely embodiments of the present disclosure. For those of ordinary skill in the art, other drawings may be obtained according to the provided drawings without any creative effort.

DETAILED DESCRIPTION

Figure 1:
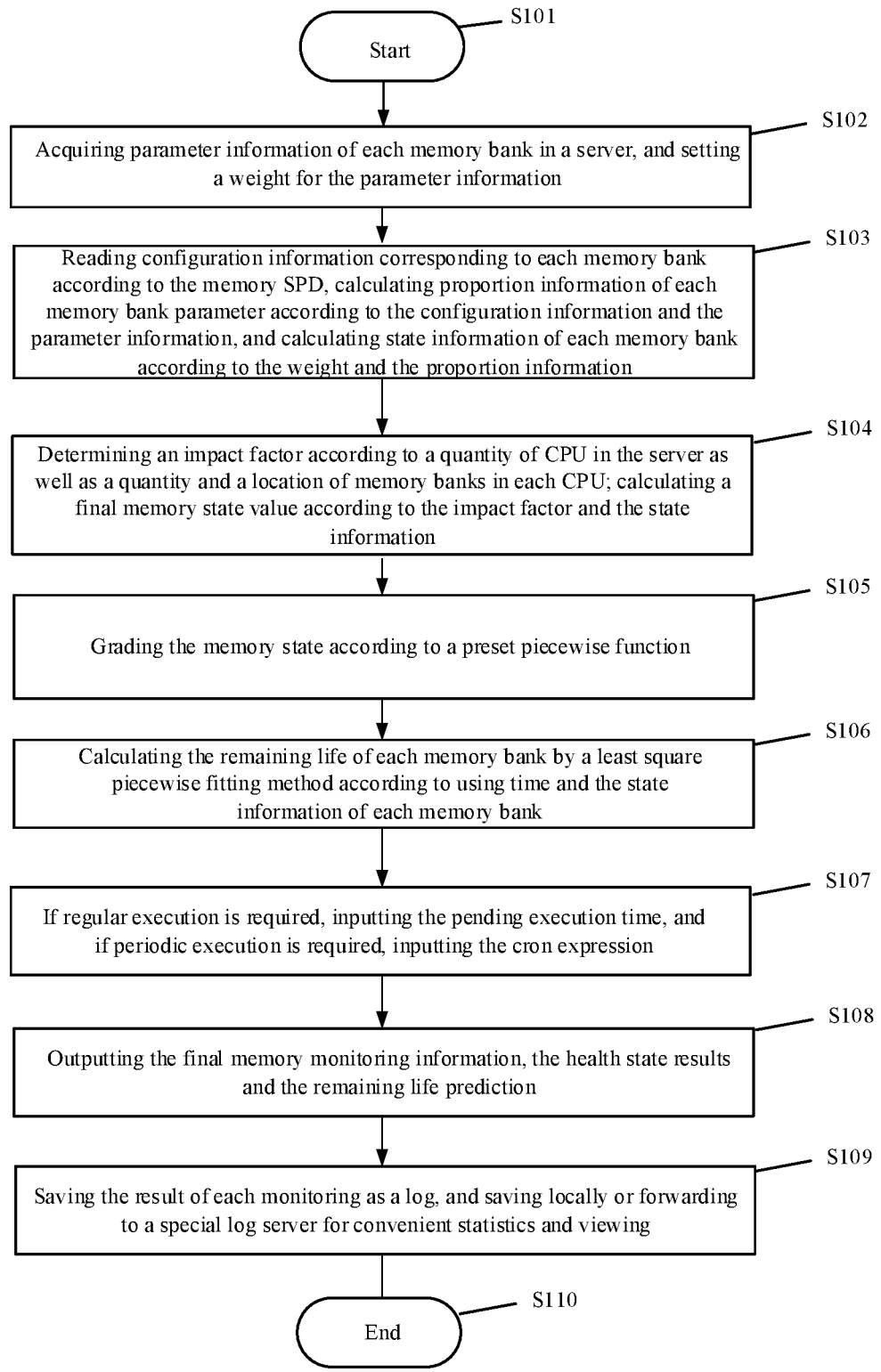
FIG. 1 shows a flow chart of an SPD-based memory monitoring and life prediction method according to embodiment 1 of the present disclosure.
Figure 2:
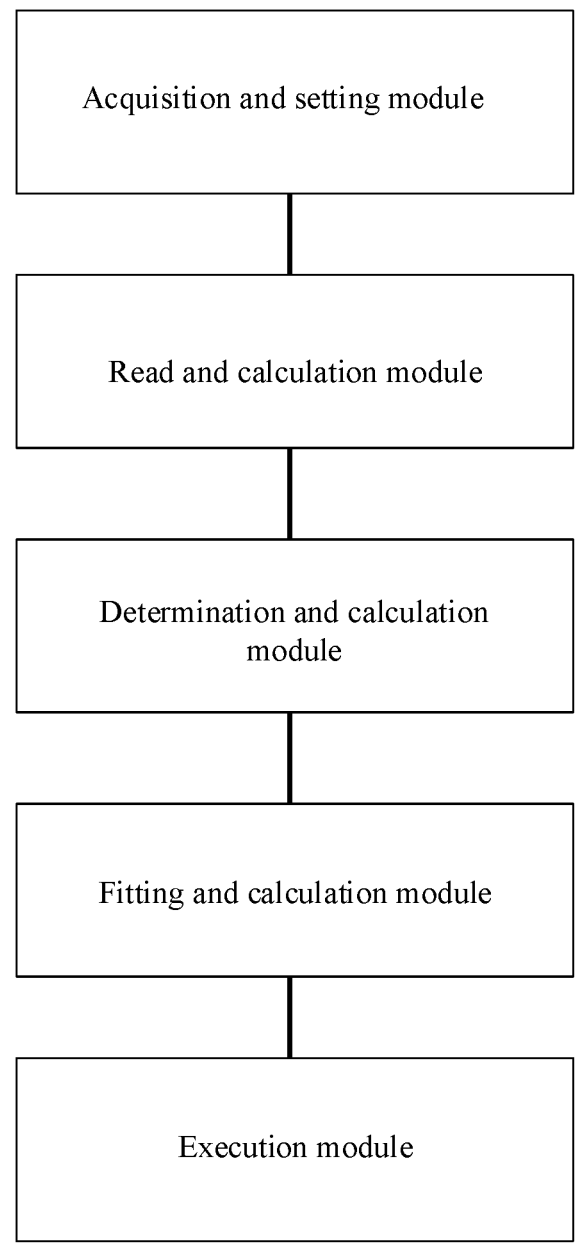
FIG. 2 shows a schematic diagram of an SPD-based memory monitoring and life prediction system according to embodiment 1 of the present disclosure.

In the following, the technical solution of the embodiment of the present application will be clearly and completely described in combination with the drawings of the embodiment of the present application. Obviously, the embodiment described is only a part of the embodiments of the present application, not the whole embodiments. Based on the embodiments in the present application, all other embodiments obtained by a person of ordinary skill in the art without making creative labor belong to the scope of protection of the present application.

In the description of the present application, it is necessary to understand that the terms 'vertical', 'horizontal', 'up', 'down', 'front', 'back', 'left', 'right', 'vertical', 'horizontal', 'top', 'bottom', 'inside', 'outside' and so on indicate the orientation or positional relationship based on the orientation or positional relationship shown in the drawing, only to facilitate the description of the present application, rather than indicating or implying that the device or component may have a specific orientation, be constructed and operated in the specific orientation, which may not be understood as a limitation to the invention.

Embodiment 1

The present disclosure provides an SPD-based memory monitoring and life prediction method and system. Serial Presence Detect (SPD) is a set of configuration information about a memory module. FIG. 1 shows a flow chart of an SPD-based memory monitoring and life prediction method according to embodiment 1 of the present disclosure.

In step S101, the process starts.

In step S102, parameter information of each memory bank in the server is acquired, and a weight is set for the parameter information. The parameter information of each memory bank in the server includes: an erasing-writing speed $v_i$, access data delay time $t_i$, a maximum frequency $f_i$ in operation, an average temperature $te_i$ and an average voltage $vo_i$ in operation; where i is a number of the memory bank. An empirical value weight is set for each parameter information of the memory based on the usage experience of the industry. In embodiment 1 of the present disclosure, set $\omega_v=0.3$, $\omega_t=0.3$, $\omega_f=0.2$, $\omega_{te}=0.1$, $\omega_{vo}=0.1$, where $\omega_f$ is a weight of the erasing-writing speed; $\omega_t$ is a weight of the access data delay time; $\omega_f$ is a weight of the maximum frequency in operation; $\omega_{te}$ is a weight of the average temperature in operation; and $\omega_{vo}$ is the weight of the average voltage in operation. The scope of protection in the technical solution is not limited to embodiment 1.

In step S103, the configuration information corresponding to each memory bank is read based on the memory SPD, where $V_i$ is an erasing-writing speed of the configuration information of the memory bank; $T_i$ is access data delay time of the configuration information of the memory bank; $F_i$ is a maximum frequency in operation of the configuration information of the memory bank; $TE_i$ is an average temperature in operation of the configuration information of the memory bank; $VO_1$ is an average voltage in operation of the configuration information of the memory bank.

A formula for calculating the proportion information of each memory bank parameter according to the configuration information and the parameter information is $$rv_i = \frac{v_i}{V_i}, rt_i = \frac{t_i}{T_i}, rf_i = \frac{f_i}{F_i}, rte_i = \frac{te_i}{TE_i}, rvo_i = \frac{vo_i}{VO_i},$$

wherein $rv_i$ is proportion information of the erasing-writing speed; $rt_i$ is proportion information of access data delay time; $rf_i$ is proportion information of the maximum frequency in operation; $rte_i$ is proportion information of average temperature in operation; $rvo_i$ is proportion information of the average voltage.

The state information of each memory bank is calculated according to the weight and the proportion information; and the state information $s_i$ of each memory bank $$s_i=\omega_v*rv_i+\omega_t*rt_i+\omega_f*rf_i+\omega_{te}*rte_i+\omega_{vo}*rvo_i.$$

In step S104, an impact factor is determined according to a quantity of CPU in the server as well as a quantity and a location of memory banks in each CPU. A server is provided with a plurality of CPUs, and each CPU may manage and control a plurality of memory banks and be plugged in slots at different locations. Here, the impact factor $\omega_i$ of each memory bank is determined according to the total number of CPU in the current server, the CPU controlled by the memory bank, and the slot location of the memory.

A final memory state value is calculated according to the impact factor and state information, wherein the memory state of $$S = \sum_{i=1}^{n}(\omega_i * s_i + \varepsilon_i) + c;$$

wherein $\varepsilon_i$ represents a random error with a mean value of 0 and a variance of 0.1; and c is a constant term. In embodiment 1 of the present disclosure, c is set to 0.05.

In step S105, a memory state S is graded according to a pre-set piecewise function to show the corresponding health state:

$$f(S) = \begin{cases} \text{normal} & (S \geq 0.5) \\ \text{warning} & (S \geq 0.1, S < 0.5) \\ \text{critical} & (S < 0.1) \end{cases}$$

In step S106, remaining life $T_i$ is calculated according to the using time $t_d$ of the memory bank and the memory state $s_i$. Different memory banks have different discrete data. By observing the distribution of the discrete data corresponding to each memory bank, Henmiter interpolation is firstly performed on the discrete data to obtain more samples of data for subsequent use. Considering the decay rate of memory usage, piecewise least squares fitting is performed. By means of the fitting method, it may obtain the fitting function $f(s_i, t_d)$ with a smallest error sum of squares, making $s_i$ tend to 0, so that the predicted total life of the memory bank may be obtained, and the remaining life $TL_i$ of the memory bank may be obtained.

In step S107, whether to execute monitoring and life prediction immediately is set. If regular execution is required, the pending execution time is input; and if periodic execution is required, the cron expression is input.

In step S108, it outputs the final memory monitoring information, the health state results and the remaining life prediction $TL_i$.

In step S109, the result of each monitoring is saved as a log, and saved locally or forwarded to a special log server for convenient statistics and viewing.

In step S110, the whole process ends.

The present disclosure also proposes an SPD-based memory monitoring and life prediction system, which includes an acquisition and setting module, a read and calculation module, a determination and calculation module as well as a fitting and calculation module.

The acquisition and setting module is configured for acquiring parameter information of each memory bank in a server, and setting a weight for the parameter information. Parameter information of each memory bank in the server includes: an erasing-writing speed $v_i$, access data delay time $t_i$, a maximum frequency f in operation, an average temperature $te_i$ in operation and an average voltage $vo_i$, where i is the number of the memory bank. An empirical value weight is set for each parameter information of the memory based on the usage experience of the industry.

The read and calculation module is configured for reading configuration information of each memory bank in the server, and calculating proportion information of each memory bank parameter according to the configuration information and the parameter information; calculating state information of each memory bank according to the weight and the proportion information; where $V_i$ is an erasing-writing speed of the configuration information of the memory bank; $T_i$ is access data delay time of the configuration information of the memory bank; $F_i$ is a maximum frequency in operation of the configuration information of the memory bank; $TE_i$ is an average temperature in operation of the configuration information of the memory bank; $VO_1$ is an average voltage in operation of the configuration information of the memory bank.

A formula for calculating the proportion information of each memory bank parameter according to the configuration information and the parameter information is $$rv_i = \frac{v_i}{V_i}, rt_i = \frac{t_i}{T_i}, rf_i = \frac{f_i}{F_i}, rte_i = \frac{te_i}{TE_i}, rvo_i = \frac{vo_i}{VO_i},$$

wherein $rv_i$ is the proportion information of the erasing-writing speed; $rt_i$ is the proportion information of access data delay time; $rf_i$ is the proportion information of the maximum frequency in operation; $rte_i$ is the proportion information of the average temperature in operation; and $rvo_i$ is the proportion information of the average voltage.

The state information of each memory bank is calculated according to the weight and the proportion information. The state information $s_i$ of each memory bank=$\omega_v*rv_i+\omega_r*rt_i+\omega_f*rf_i+\omega_{te}*rte_i+\omega_{vo}*rvo_i$.

The determination and calculation module is configured for determining an impact factor according to a quantity of CPU in the server as well as a quantity and a location of memory banks in each CPU; calculating a final memory state value according to the impact factor and the state information, and grading the state value; and determining an impact factor according to the number of CPU in the server as well as the number and the location of memory banks in each CPU. A server is provided with a plurality of CPUs, and each CPU may manage and control a plurality of memory banks and be plugged in slots at different locations. Here, the impact factor $\omega_i$ of each memory bank is determined according to the total number of CPU in the current server, the CPU controlled by the memory bank, and the slot location of the memory.

A final memory state value is calculated according to the impact factor and the state information, and the memory state $$S = \sum_{i=1}^{n}(\omega_i * s_i + \varepsilon_i) + c;$$

wherein $\varepsilon_i$ represents a random error with a mean value of 0 and a variance of 0.1; and c is a constant term.

In embodiment 1 of the present disclosure, c is set to 0.05.

The memory state S is graded according to a pre-set piecewise function to show the corresponding health state:

$$f(S) = \begin{cases} \text{normal} & (S \geq 0.5) \\ \text{warning} & (S \geq 0.1, S < 0.5) \\ \text{critical} & (S < 0.1) \end{cases}$$

The fitting and calculation module is configured for calculating remaining life of each memory bank by a least squares piecewise fitting method according to the using time and the state information of each memory bank. The remaining life $T_i$ is calculated according to the using time $t_d$ and the memory state $s_i$ of the memory bank. Different memory banks have different discrete data. By observing the distribution of the discrete data corresponding to each memory bank, Henmiter interpolation is firstly performed on the discrete data to obtain more samples of data for subsequent use. Considering the decay rate of memory usage, piecewise least squares fitting is performed. By means of the fitting method, it may obtain the fitting function f ($s_i$, $t_d$) with a smallest error sum of squares, making $s_i$ tend to 0, so that the predicted total life of the memory bank may be obtained, and then the remaining life $TL_i$ of the memory bank.

The system further includes an execution module configured for setting a pending execution time to perform regular execution monitoring and memory bank life prediction; or setting a cron expression to perform periodic execution monitoring and memory bank life prediction.

The above content is only an example and description of the structure of the present disclosure. A person skilled in the art make various modifications or supplements to the specific embodiments described or replace them in a similar way. Only they do not deviate from the structure of the present disclosure or exceed the scope defined in this claim, they should belong to the protection scope of the present disclosure.

The invention claimed is:

1. An SPD-based memory monitoring and life prediction method, comprising:
   acquiring parameter information of each memory bank in a server, and setting a weight for the parameter information;
   reading configuration information of each memory bank in the server, and calculating proportion information of each memory bank parameter according to the configuration information and the parameter information; calculating state information of each memory bank according to the weight and the proportion information;
   determining an impact factor according to a quantity of CPU in the server as well as a quantity and a location of memory banks in each CPU; calculating a final memory state value according to the impact factor and the state information, and grading the state value; and
   calculating remaining life of each memory bank by a least square piecewise fitting method according to using time and the state information of each memory bank.

2. The SPD-based memory monitoring and life prediction method according to claim 1, wherein the method further comprises:
   setting pending execution time to perform regular execution monitoring and memory bank life prediction; and
   setting a cron expression to perform periodic execution monitoring and memory bank life prediction.

3. The SPD-based memory monitoring and life prediction method according to claim 1, wherein the parameter information of each memory bank in the server comprises an erasing-writing speed $v_i$, access data delay time $t_i$, a maximum frequency $f_i$ in operation, an average temperature $te_i$ and an average voltage $vo_i$ in operation; where i is a number of the memory bank.

4. The SPD-based memory monitoring and life prediction method according to claim 3, wherein a formula for calculating the proportion information of each memory bank parameter according to the configuration information and the parameter information is $$rv_i = \frac{v_i}{V_i}, rt_i = \frac{t_i}{T_i}, rf_i = \frac{f_i}{F_i}, rte_i = \frac{te_i}{TE_i}, rvo_i = \frac{vo_i}{VO_i}$$

wherein $rv_i$ is proportion information of the erasing-writing speed; $rt_i$ is proportion information of access data delay time; $rf_i$ is proportion information of the maximum frequency in operation; $rte_i$ is proportion information of the average temperature in operation; $rvo_i$ is proportion information of the average voltage; $V_i$ is erasing-writing speed of the configuration information of the memory bank; $T_i$ is access data delay time of the configuration information of the memory bank; $F_i$ is maximum frequency in operation of the configuration information of the memory bank; $TE_i$ is average temperature in operation of the configuration information of the memory bank; and $VO_i$ is average voltage in operation of the configuration information of the memory bank.

5. The SPD-based memory monitoring and life prediction method according to claim 4, wherein a formula for calculating the state information of each memory bank according to the weight and the proportion information is: the state information $s_i$ of each memory bank=$\omega_v*rv_i+\omega_t*rt_i+\omega_f*rf_i+\omega_{te}*rte_i+\omega_{vo}*rvo_i$; where $\omega_v$ is a weight of the erasing-writing speed; $\omega_t$ is a weight of the access data delay time; $\omega_f$ is a weight of maximum frequency in operation; $\omega_{te}$ is a weight of the average temperature in operation; and $\omega_{vo}$ is a weight of the average voltage in operation.

6. The SPD-based memory monitoring and life prediction method according to claim 5, wherein a formula for calculating the final memory state value according to the impact factor and the state information is: the memory state $$S = \sum_{i=1}^{n}(\omega_i * s_i + \varepsilon_i) + c;$$

wherein $\omega_i$ represents an impact factor; $\varepsilon_i$ represents a random error with a mean value of 0 and a variance of 0.1; and c is a constant term.

7. The SPD-based memory monitoring and life prediction method according to claim 6, wherein the method of calculating the remaining life of each memory bank by a least square piecewise fitting method according to the using time and the state information of each memory bank comprises:
  performing data interpolation and piecewise least square fitting for discrete data corresponding to each memory bank to obtain a fitting function $f(s_i, t_d)$ with a smallest error sum of squares corresponding to each memory bank; and
  making $s_i$ tend to zero to obtain the predicted total life of the memory bank, and obtain the remaining life $TL_i$ of the memory bank.

8. The SPD-based memory monitoring and life prediction method according to claim 7, wherein after the step of setting a cron expression to perform periodic execution monitoring and memory bank life prediction, the method further comprises:
  outputting results of each monitoring.

9. The SPD-based memory monitoring and life prediction method according to claim 8, wherein the results of each monitoring comprise at least one of final memory monitoring information, health state results and the remaining life.

10. The SPD-based memory monitoring and life prediction method according to claim 9, wherein the method further comprises:
  saving the results of each monitoring as a log.

11. The SPD-based memory monitoring and life prediction method according to claim 10, wherein the log is saved in local or in a log server.

12. The SPD-based memory monitoring and life prediction method according to claim 6, wherein a health state f(S) is determined by grading the memory state S according to a pre-set piecewise function:

$$f(S) = \begin{cases} \text{normal} & (S \geq 0.5) \\ \text{warning} & (S \geq 0.1, S < 0.5) \\ \text{critical} & (S < 0.1) \end{cases}.$$

13. The SPD-based memory monitoring and life prediction method according to claim 1, wherein the server is provided with a plurality of CPUs, each CPU manages and controls a plurality of memory banks and is plugged in slots at different locations.

14. An SPD-based memory monitoring and life prediction system, comprising a processor; and
  a memory, storing a computer program that is executed by the processor, and upon execution by the processor, is configured to cause the processor to implement operations comprising:
  acquiring parameter information of each memory bank in a server, and setting a weight for the parameter information;
  reading configuration information of each memory bank in the server, and calculating proportion information of each memory bank parameter according to the configuration information and the parameter information; calculating state information of each memory bank according to the weight and the proportion information;
  determining an impact factor according to a quantity of CPU in the server as well as a quantity and a location of memory banks in each CPU; calculating a final memory state value according to the impact factor and the state information, and grading the state value; and
  calculating remaining life of each memory bank by a least square piecewise fitting method according to the using time and the state information of each memory bank.

15. The SPD-based memory monitoring and life prediction system according to claim 14, wherein the operations further comprise:
  setting a pending execution time to perform regular execution monitoring and memory bank life prediction; or setting a cron expression to perform periodic execution monitoring and memory bank life prediction.

16. The SPD-based memory monitoring and life prediction system according to claim 14, wherein the parameter information of each memory bank in the server comprises an erasing-writing speed $v_i$, access data delay time $t_i$, a maximum frequency $f_i$ in operation, an average temperature $te_i$ and an average voltage $vo_i$ in operation; where i is a number of the memory bank.

17. The SPD-based memory monitoring and life prediction system according to claim 16, wherein a formula for calculating the proportion information of each memory bank parameter according to the configuration information and the parameter information is $$rv_i = \frac{v_i}{V_i}, rt_i = \frac{t_i}{T_i}, rf_i = \frac{f_i}{F_i}, rte_i = \frac{te_i}{TE_i}, rvo_i = \frac{vo_i}{VO_i}$$

wherein $rv_i$ is proportion information of the erasing-writing speed; $rt_i$ is proportion information of access data delay time; $rf_i$ is proportion information of the maximum frequency in operation; $rte_i$ is proportion information of the average temperature in operation; $rvo_i$ is proportion information of the average voltage; $V_i$ is erasing-writing speed of the configuration information of the memory bank; $T_i$ is access data delay time of the configuration information of the memory bank; $F_i$ is maximum frequency in operation of the configuration information of the memory bank; $TE_i$ is average temperature in operation of the configuration information of the memory bank; and $VO_i$ is average voltage in operation of the configuration information of the memory bank.

18. The SPD-based memory monitoring and life prediction system according to claim 17, wherein a formula for calculating the state information of each memory bank according to the weight and the proportion information is: the state information $s_i$ of each memory bank=$\omega_v *rv_i + \omega_t*rt_i+\omega_f*rf_i+\omega_{te}*rte_i+\omega_{vo}*rvo_i$; where $\omega_v$ is a weight of the erasing-writing speed; $\omega_t$ is a weight of the access data delay time; $\omega_f$ is a weight of maximum frequency in operation; $\omega_{te}$ is a weight of the average temperature in operation; and $\omega_{vo}$ is a weight of the average voltage in operation.

19. The SPD-based memory monitoring and life prediction system according to claim 18, wherein the operations further comprise:
    outputting results of each monitoring; the results of each monitoring comprise at least one of final memory monitoring information, health state results and the remaining life.

20. The SPD-based memory monitoring and life prediction system according to claim 14, wherein the server is provided with a plurality of CPUs, each CPU manages and controls a plurality of memory banks and is plugged in slots at different locations.

* * * * *